United States Patent [19]
Moslehi

[11] Patent Number: 5,184,398
[45] Date of Patent: Feb. 9, 1993

[54] IN-SITU REAL-TIME SHEET RESISTANCE MEASUREMENT METHOD

[75] Inventor: Mehrdad M. Moslehi, Dallas, Tex.

[73] Assignee: Texas Instruments Incorporated, Dallas, Tex.

[21] Appl. No.: 752,742

[22] Filed: Aug. 30, 1991

[51] Int. Cl.⁵ .......................................... H01R 43/00
[52] U.S. Cl. .......................................... 29/825; 269/8; 361/239
[58] Field of Search ................ 269/8, 903; 361/234; 29/825

[56] References Cited

U.S. PATENT DOCUMENTS

| | | | |
|---|---|---|---|
| 4,502,094 | 2/1985 | Lewin et al. | 269/8 X |
| 4,554,611 | 11/1985 | Lewin | 361/234 |
| 4,665,463 | 5/1987 | Ward et al. | 361/234 |
| 4,724,510 | 2/1988 | Wickes et al. | 361/234 |
| 4,962,441 | 10/1990 | Collins | 361/234 |
| 5,001,594 | 3/1991 | Bobbio | 361/234 |
| 5,055,964 | 10/1991 | Logan et al. | 361/234 |

FOREIGN PATENT DOCUMENTS

61-56842 3/1986 Japan ............................ 269/8

Primary Examiner—Carl J. Arbes
Attorney, Agent, or Firm—Ira S. Matsil; James C. Kesterson; Richard L. Donaldson

[57] ABSTRACT

A system 20 for measuring the sheet resistance of a conductive layer on the top surface of a semiconductor wafer 22 is disclosed herein. In one embodiment, the system includes a chuck 30 electrically coupled to the backside surface of the wafer 22. The chuck 30 is capable of supporting the wafer 22 electrostatically. A signal source 40 provides an excitation signal to the wafer 22 and circuitry for monitoring an induced signal is provided. The sheet resistance on the top surface of the wafer 22 is determined from the measurements of the excitation and induced electrical signals. Other systems and methods are also disclosed.

20 Claims, 9 Drawing Sheets

IN-SITU REAL-TIME SHEET RESISTANCE MEASUREMENT METHOD

FIELD OF THE INVENTION

This invention generally relates to the fabrication of semiconductor devices and specifically to an in-situ real-time sheet resistance measurement sensor system and method.

BACKGROUND OF THE INVENTION

The in-situ measurements of conductive layer sheet resistance values during microelectronic device fabrication can provide valuable information for process control and real-time process end point detection applications. Example processes include chemical vapor deposition (CVD), processes for conductive layers such as tungsten, aluminum, copper; physical vapor deposition (PVD) of conductive layers; and plasma etch processes used for patterning conductors. Sheet resistance sensors may be used to monitor and control the etch or deposition processes in real time, or pre-process/post-process sensors, for example to be implemented in a vacuum load-lock chamber. These types of sensors are very useful for feedback process control as well as process and equipment diagnosis/prognosis.

There are several types of in-situ sensors which have been proposed in the past for CVD metal film thickness and or sheet resistance measurements. For example, an Eddy current sensor is a non-invasive in-situ (but not real time) sensor for pre-process/post-process measurements of metal film sheet resistance. Since this sensor is not real time, it cannot be used for many process end-point control applications.

A two-point probe employs two conductive wafer support pins to make electrical contact to the front side of the wafer edge within the metal deposition, for example tungsten CVD, process chamber. This is a contact type in-situ real-time sensor and can suffer from some limitations. This sensor depends on measurements of DC current and voltages between the two conductive wafer probe pins As a result, its operation is sensitive to the contact resistance and/or potential values between the pins and wafer surface in the chamber. The probe contact resistance/potential and its temperature dependence can result in measurement uncertainties.

A microwave-based sheet resistance sensor is a non-invasive real-time in-situ sensor for metal sheet resistance measurements. Its operation is based on the use of microwaves (12-18 GHz) as a probe beam. This sensor, however, only provides an average sheet resistance value due to the large probe beam size. In other words, no real-time uniformity measurements may be made.

A fiber-optic scattering-base sensor is a non-invasive in-situ (but not real-time) sensor for pre-process/post-process measurements of CVD metal film thicknesses via surface roughness measurments. So once again, since the sensor is not real time it cannot be used for many real-time process end-point control applications.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for an in-situ real-time sheet resistance measurement system.

A sensor system for measuring the sheet resistance of a conductive layer on the top surface of a semiconductor wafer is disclosed herein. In one embodiment, the sensor system includes a chuck electrically coupled to the bottom surface of the wafer. The chuck is capable of supporting the wafer electrostatically. A signal source provides an alternating current (AC) excitation signal coupled to the wafer backside and circuitry for monitoring the excitation and detected signals is provided. The sheet resistance of the conductive layer on the wafer top surface is determined from real-time measurements of the excitation and detected signals.

In one embodiment, the electrostatic chuck comprises a main chuck body for supporting the semiconductor wafer within a processing chamber. At least two electrodes are formed on the surface of the main chuck body but electrically insulated therefrom. The electrodes are also electrically and capacitively coupled to a bottom surface of the wafer. Circuitry is connected to the electrodes for receiving an electrical AC signal with an excitation frequency optimized for the range of sheet resistance values to be measured.

There is currently a need for low-cost sensors for in-situ and or real time in-situ conductive film sheet resistance or thickness measurements for etch and deposition applications. Such sensors can have a significant impact on the CVD (chemical vapor deposition) and PVD (pressure vapor deposition) processes used for deposition of tungsten, aluminum, and titanium (as well as other metals and metal silicides). Moreover, they can also be used for process control and end-point detection purposes in plasma etch reactors.

An advantage of the sensor of this invention is that it does not require any front-side mechanical or electrical contacts to the wafer and, as a result, is non-invasive.

In addition, this sensor is compatible with various types of LPCVD (low-pressure chemical-vapor deposition) or PECVD (plasma-enhanced chemical-vapor deposition) and plasma etch reactors used for conductive layer processing in semiconductor device manufacturing.

Further, the associated electrostatic chuck ensures uniform contact to the backside of the wafer without charging the wafer surface.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. The preferred embodiment will be described first followed by a description of modifications. The method of using the invention will then be described.

Figure 1:
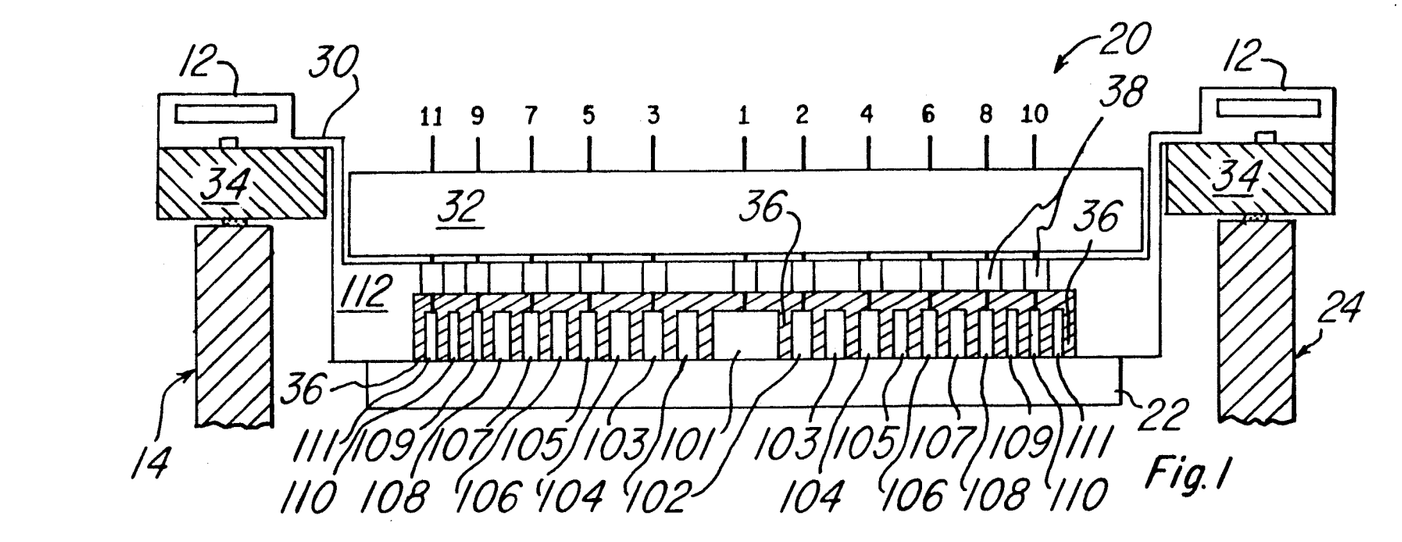
FIG. 1 is cross-sectional view of an exemplary embodiment system.

Referring first to FIG. 1, a sensor system 20 for measuring sheet resistance of a conductive layer and its uniformity on the surface of a wafer 22 is shown. In the embodiment shown, the process occurs in a single-wafer deposition or etch process chamber. Illustrated are chamber walls 24 which isolate the wafer being processed from the outside atmosphere. This process may occur under vacuum or low pressure conditions, but this is not a necessary condition for opertion. In fact, the process does not require a process chamber at all.

The sheet resistance of the conductive layer on the top of the wafe 22 may be measured during a great number of different processes. These processes include CVD or PVD for deposition of metals such as aluminum and titanium as well as others.

In addition, low-temperature etches, such as tungsten, aluminum, or copper for example, may be performed. The method may also be used during metal evaporation operations.

The sheet resistance information measured may in turn be fed back into the controller which controls the process to more precisely fabricate the device. In addition, the present invention may be used with plasma enhanced deposition and etch processes.

The present invention may be used for process uniformity control and end-point detection. For example, it may be used to determine when an etch process is complete, thereby avoiding under etch or over etch. In addition, it can control process rates for either deposition or etch. For example, a constant process rate may now be achieved. Further, process and equipment diagnosis and prognosis may be simplified by utilizing the present invention. The method and system of the present invention can measure sheet resistance uniformity as well as the average sheet resistance value, both in real time.

The distributive probe electrodes on a wafer backside operate based on the concept of the so-called "4-point probe" technique. Major differences between the design and operation of this sensor and the conventional "4-point probe" used for off-line sheet resistance measurements in semiconductor manufacturing exist. The sensor of this invention is embedded in an electrostatic chuck (with options for RF plasma, wafer heating and wafer cooling) for in-situ sheet resistance measurements of conductive films. The sensor of this invention also employs multiple distributed probe electrodes with circular symmetry and finite probe areas. This will provide real-time radial sheet resistance uniformity data. In addition, this sensor operates based on capacitive coupling of an RF electrical probe signal (current or voltage) to wafer backside. No DC current flows between the electrodes. Any dielectrics on the wafer backside will have negligible effects on the accuracy of the wafer conductive film sheet resistance measurements.

Referring once again to FIG. 1, electrostatic chuck 30 is provided for mechanically supporting the wafer 22 as well as providing the electrical probe connections to perform the sheet resistance measurements. The chuck 30 is typically fabricated from an electrically and thermally conductive material such as aluminum, stainless steel, or refractory metal such as nickel or molybdenum (or their alloys) or high temp alloys such as monel.

Adjacently connected to chuck 30 is heating/cooling module 32 which may be provided to control the temperature at which processing occurs. The present invention may be used at any of the wide range of temperatures at which semiconductor processing occurs for conductive layer deposition and etch applications since the temperature effects on the measurements can be easily calibrated and accounted for.

The chuck 30 is separated from the chamber walls by an electrically insulating material 34. The material 34 may be quartz or other electrically insulating materials. As illustrated, the insulating material 34 may be separated from the wall by a gasket to maintain vacuum or low pressures in the enclosed region near the wafer.

Figure 2:
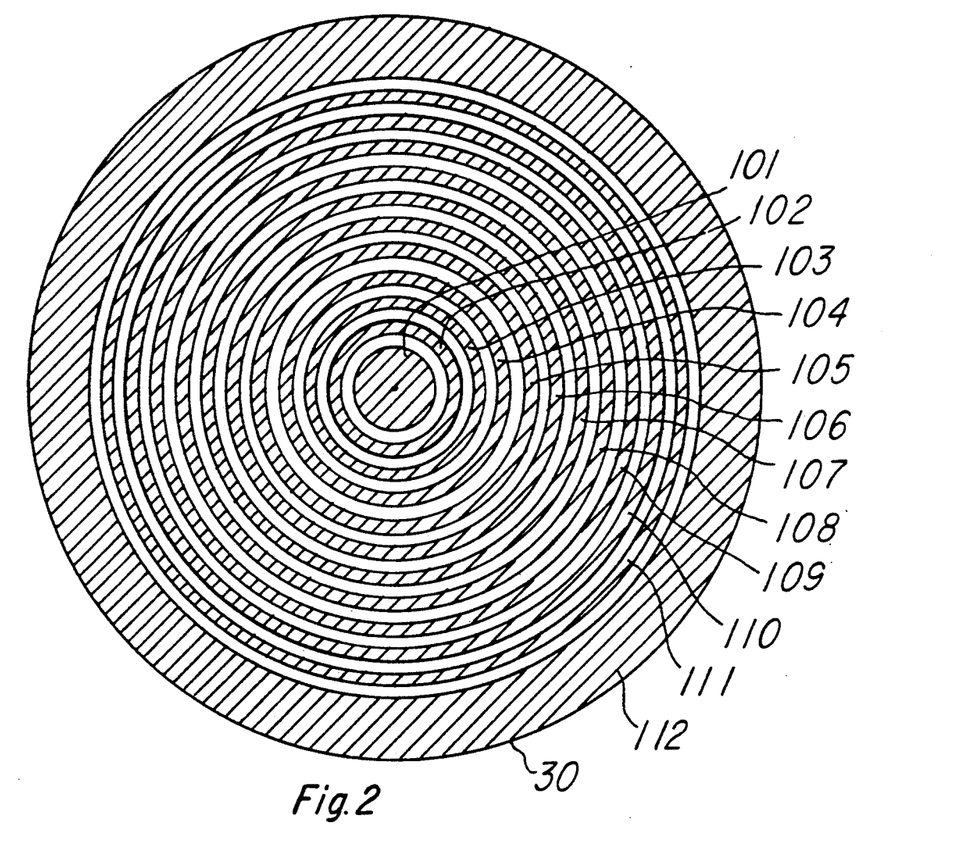
FIG. 2 is a top view of a preferred embodiment electrostatic chuck and distributed sensor electrode pattern.

Embedded in the chuck are circular electrodes 101-111. The chuck itself will serve as the 12th electrode. Although shown with 12 electrodes, any number (greater than 1) of electrodes can be used. It has been found that 12 is a good number of electrodes for a six-inch wafer. In general, the maximum number of electrodes is determined by the required spatial resolution and the wafer size. Two electrodes, the minimum number, will give only average measurements without any specific radial uniformity data. In the preferred embodiment, the electrodes are circular in shape as shown in FIG. 2.

Electrodes 101-111 are electrically isolated from the main body of chuck 30 by spacers 36. The spacers 36 are typically formed from an electrically insulating but thermally conductive material. Exemplary materials which can be used for spacer 36 include boron nitride and aluminum nitride.

The electrodes 101-111 are electrically coupled to the sensing and control equipment (not shown) by wires which run through holes 38 formed in the chuck 30. The location of the holes 38 are determined by design choice based upon the mechanical design, i.e., the best suitable locations for wiring.

The surfaces of all the electrodes 101-111 are covered with a thin (typically less than a few microns) insulating material such as silicon oxide or aluminum oxide, for example. The exact thickness will be determined based upon the choice of the RF probe frequency. This is done for surface passivation of the probe electrodes and prevention of any DC current path. However, the use of external capacitors in series with the electrodes also block DC current. As a result, the use of an insulating film on the distributed electrodes is not essential. Electrode passivation is not necessary if the wafer backsides are covered with insulating layers such as silicon oxide or nitride.

FIG. 2 illustrates a simplified schematic of an electrostatic chuck 30 and the associated sheet resistance sensor electrodes, for a single-wafer deposition or etch equipment. The chuck 30 has a distributed electrode array for electrostatic chuck operation as well as the sensor. The figure shows multiple circular electrodes made of a conductive, maybe metallic, material. For example, aluminum, stainless steel, molybdenum, nickel, or any other suitable material may be used. The electrodes shown here have cylindrical symmetry (circular electrodes). Other configurations, such as square or rectangular electrodes may also be used. The optimum number of electrodes depends on a number of factors such as wafer size, surface areas of electrodes, amount of spacial resolution for uniformity measurements, and RF signal frequency.

The example shown in FIG. 2 demonstrates a total of 12 electrodes. The first electrode is at the center and the 12th electrode is connected to the main body of the chuck 30 and contacts the wafer 22 edge. As an example, the maximum number of electrodes should not exceed 1/10th of the ratio between the wafer diameter and the wafer thickness. This will ensure that the electrode to electrode spacing is much greater than the wafer thickness.

In one case, the electrode diameters may be chosen such that the area of each electrode 101-111 is the same. In another case, the electrode widths are all equal. In still other cases, the electrode widths may be determined by other criteria and as such each electrode width may be chosen independently.

One exemplary method to fabricate the electrostatic chuck is to begin with a disk of boron nitride. Circular grooves are machined into the disk. The thin electrode rings 101-111 are formed and placed into the grooves in the main body of the chuck. For example, for low temperature applications, aluminum electrodes may be used; while at high temperature CVD applications, a refractory metal such as nickel or a high temperature alloy such as monel may be used.

Figure 3:
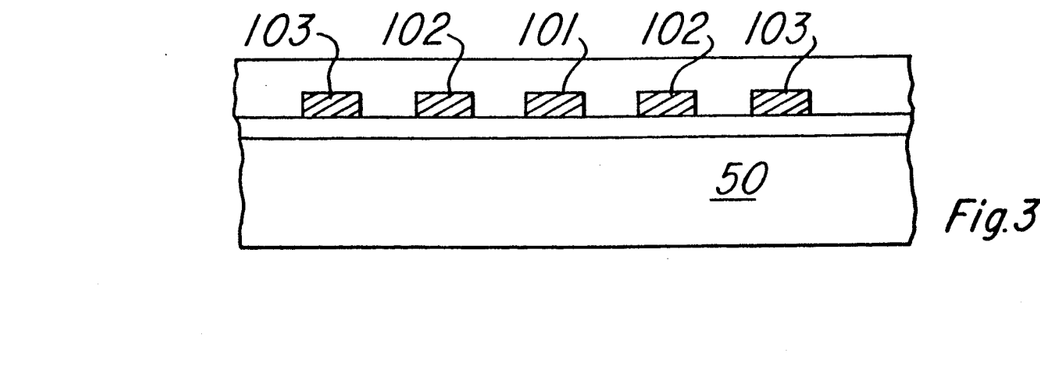
FIG. 3 is a cross-sectional view of an alternate embodiment chuck and associated sensor.

It is also possible to use an alternative approach to fabricate the distributed electrodes on a high thermal conductivity wafer 50 such as boron nitride (FIG. 3). The distributed electrodes 101-103 can be sputtered and patterned on a boron nitride wafer 50 as illustrated in FIG. 3. The electrodes 101-103 may comprise a refractory metal such as molybdenum, nickel, platinum, or cobalt and may be deposited (for example, 1 to 2 microns) by PVD onto the buffer layer 52 which has been formed on the boron nitride wafer 50. A layer 54 of insulating material such as silicon oxide is then formed over the electrodes 101-103. Electrical connections to the front probe electrodes are made through wafer vias (not shown).

Figure 4A:
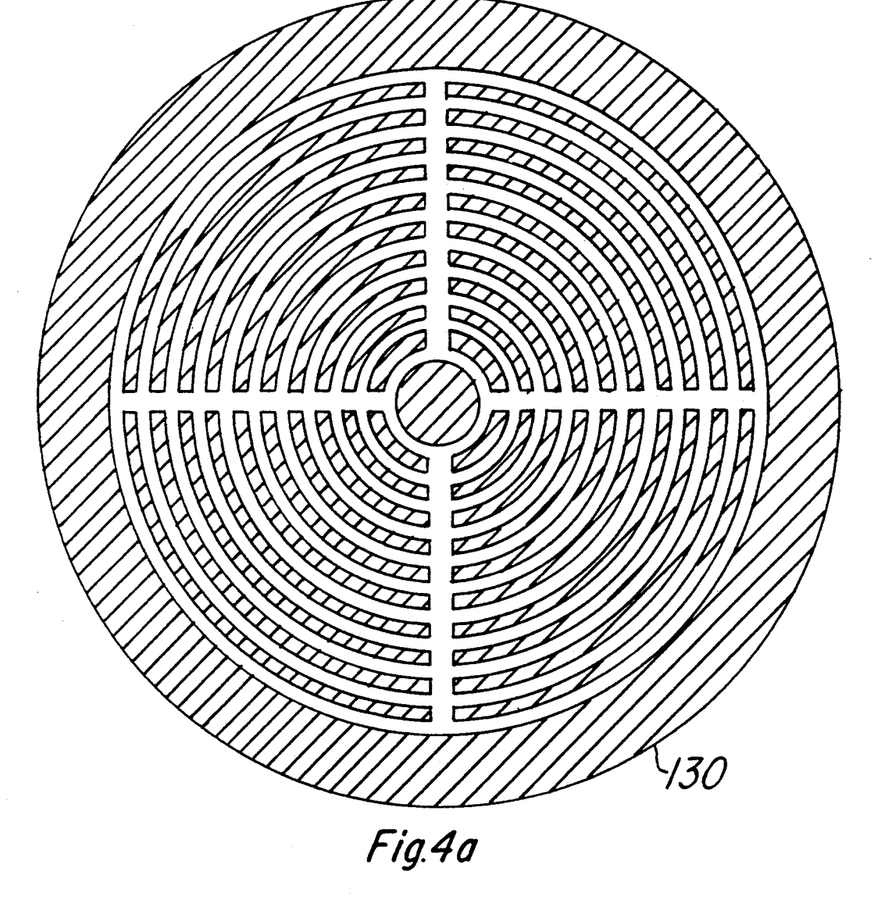
FIGS. 4a and 4b are alternate embodiment electrostatic chuck and distributed sensor electrode patterns.
Figure 6A:
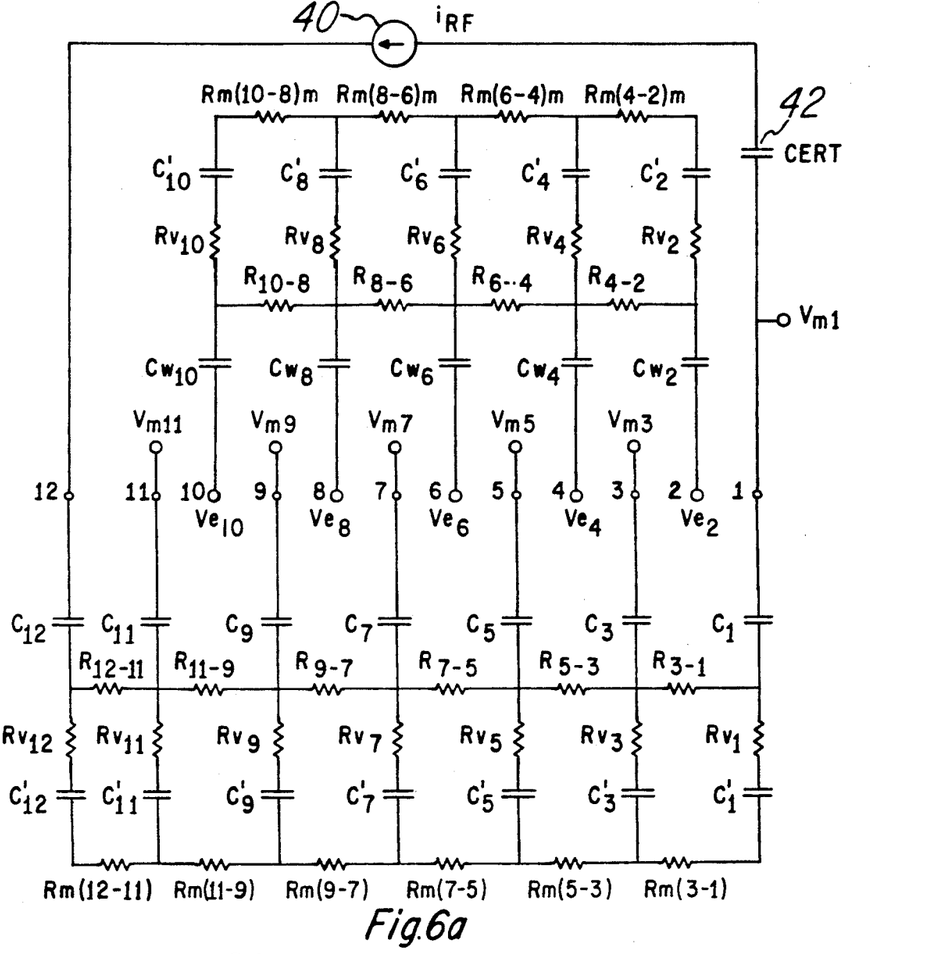
FIG. 6a is a schematic diagram of an equivalent circuit which may be used to better understand the system operation.

Referring now to FIG. 4a, an alternate electrode pattern is shown. Here, each of the ring electrodes 101-111 is divided into more than one portion (4 in the case shown). During operation (which will be explained in more detail with respect to FIG. 6) of a sensor system using electrode pattern as shown in FIG. 2, i.e., each concentric ring continuous, radial sheet resistance information may be obtained. On the other hand, with the electrode pattern shown in FIG. 4a, circumferential as well as radial information may be determined. The number of sections used is determined through the trade-off of system complexity versus level of uniformity resolution required. For example, if less detailed uniformity information is required, then each electrode may be divided into less, possibly two, portions. While if more information is required, each electrode may be divided into four, eight or ten quadrants, for example.

Figure 4B:
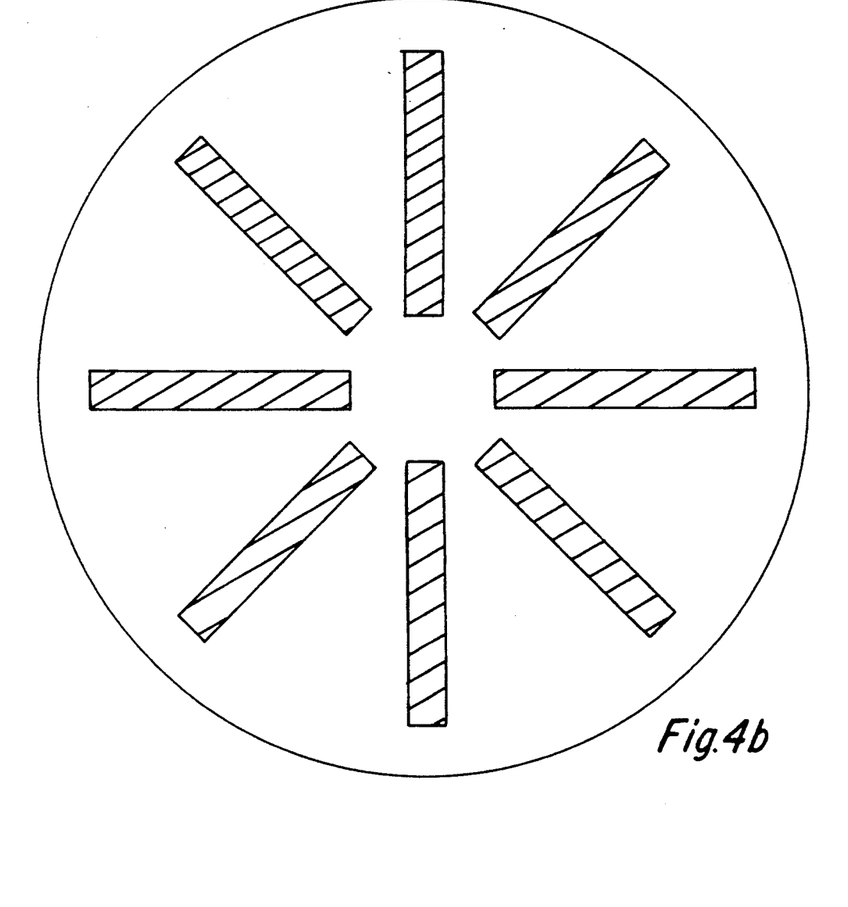

Yet another electrode pattern is shown in FIG. 4b. Here substantially circumferential sheet resistance measurement data will be obtained.

Figure 5A:
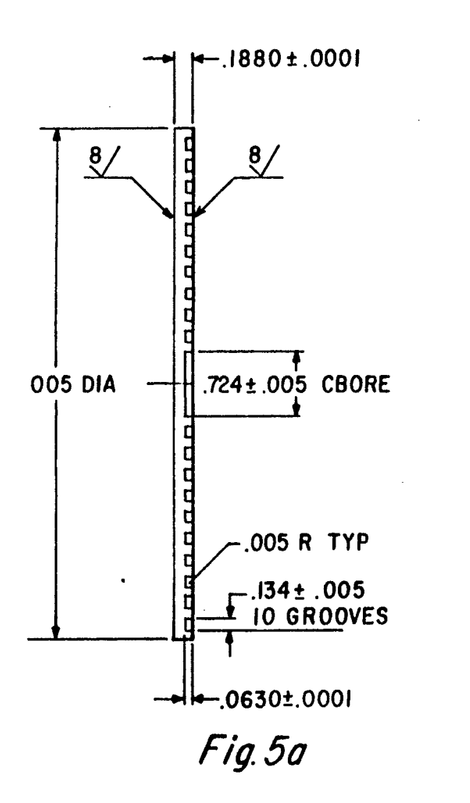
FIGS. 5a-5d illustrate an exemplary chuck embodiment with the distributed sensor electrodes.
Figure 5B:
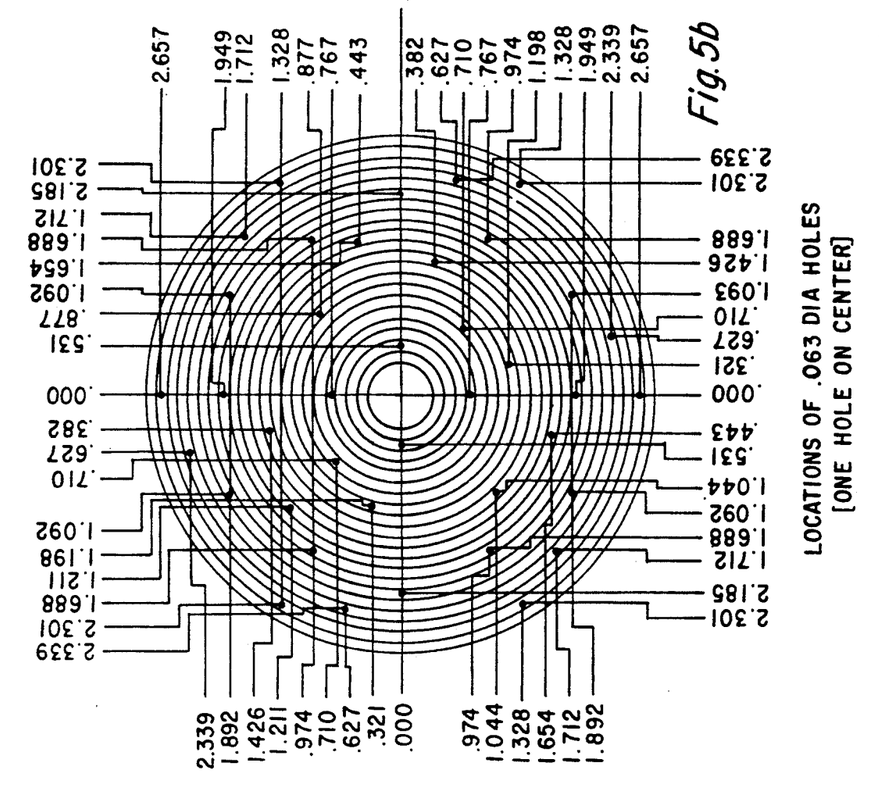
Figure 5C:
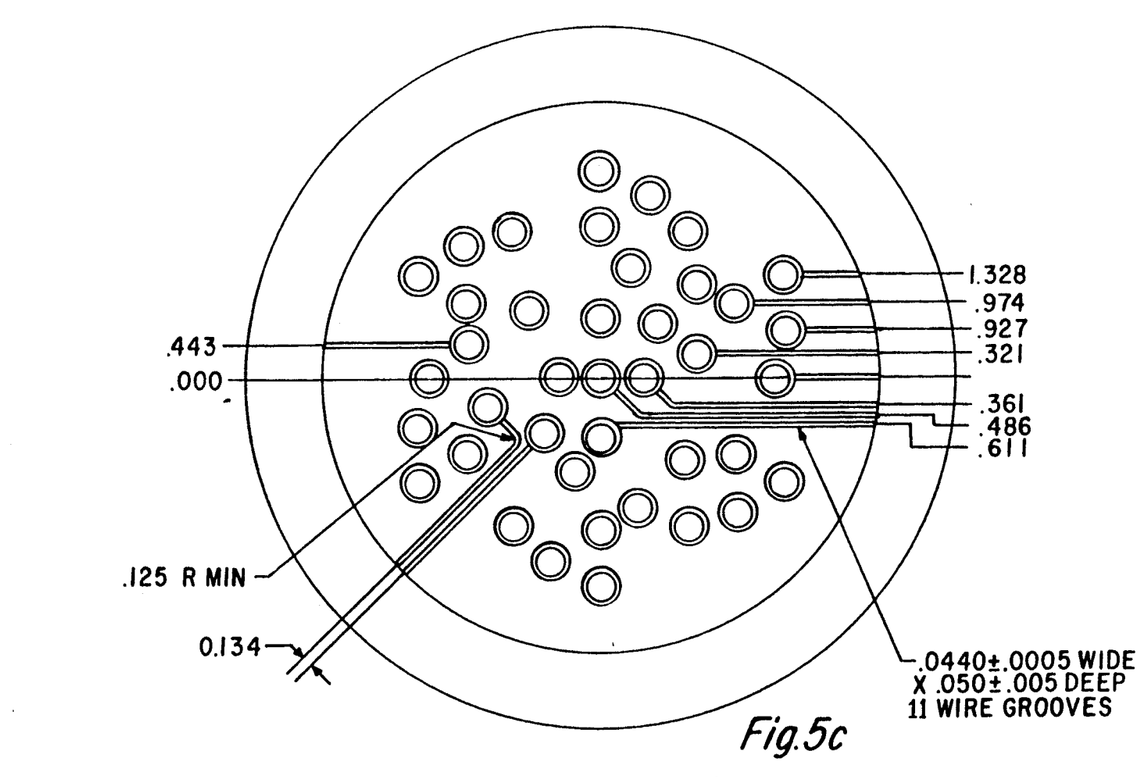
Figure 5D:
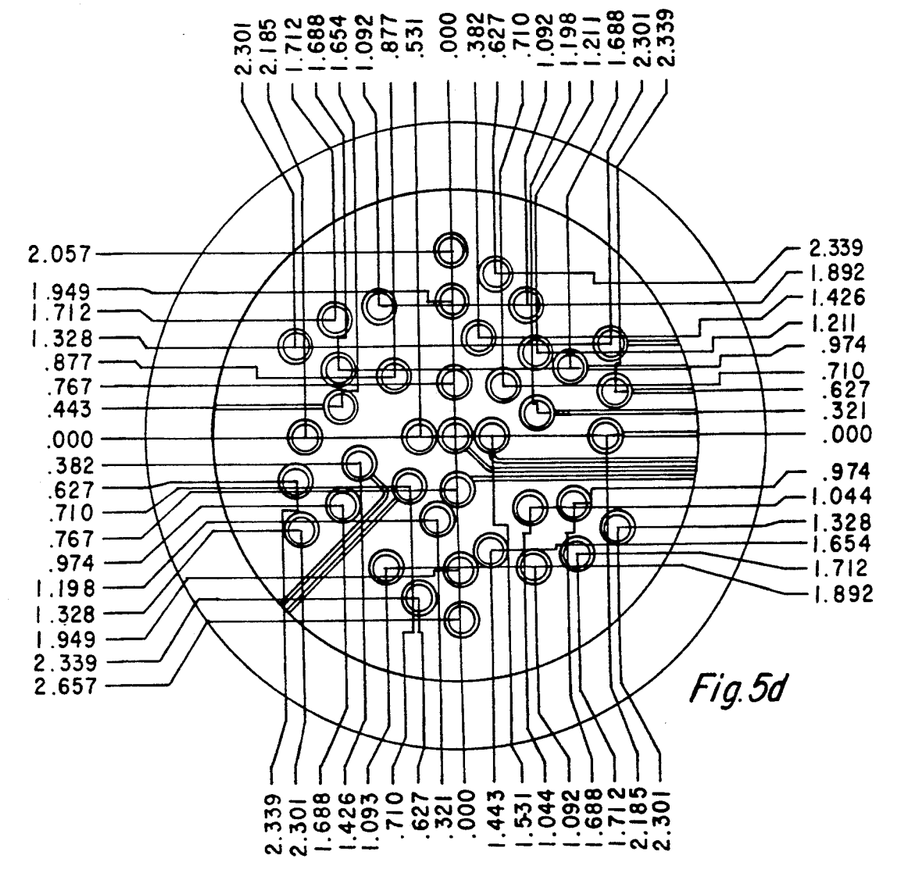

An exemplary preferred embodiment is illustrated in FIGS. 5a through 5d. In this example, equal width electrodes have been chosen. The dimensions of the electrodes are shown in FIGS. 5a and 5b while the location of the wire holes 38 are shown in FIGS. 5c and 5d.

The inner and outer diameters, areas and capacitance of each of the electrodes in the exemplary preferred embodiment are shown in Table 1.

TABLE 1

| Electrode | Inner Diameter (mm) | Outer Diameter (mm) | Area (mm$^2$) | Capacitance (nF) |
|---|---|---|---|---|
| 1 | NA | 18 | 254.47 | 4.39 |
| 2 | 24 | 30 | 254.47 | 4.39 |
| 3 | 36 | 42 | 367.57 | 6.35 |
| 4 | 48 | 54 | 480.66 | 8.30 |
| 5 | 60 | 66 | 593.76 | 10.25 |
| 6 | 72 | 78 | 706.86 | 12.21 |
| 7 | 84 | 90 | 819.96 | 14.16 |
| 8 | 96 | 102 | 933.05 | 16.11 |
| 9 | 108 | 114 | 1046.11 | 18.07 |
| 10 | 120 | 126 | 1159.25 | 20.02 |
| 11 | 132 | 138 | 1272.35 | 21.97 |
| 12 | 144 | 150 | 1385.44 | 23.93 |

As shown in Table 1, the probe capacitances range in values between 4.39 and nF for probe number 1 at the center to 23.93 nF for the probe at the edge (number 12 or the main chuck overlapping the wafer). All of these values are based on the assumption that there is a equivalent dielectric thickness of approximately 2 microns of silicon dioxide between the distributed electrodes and wafer backside.

One exemplary case will now be described to understand the operation of the circuit. Assume the chuck has 12 electrodes where electrode number 1 is the central electrode. The electrode number 12 is the edge electrode connected to the main body of the chuck and overlapping the wafer edge region. In this example, an electrode pattern as illustrated in FIG. 2 will be used. There are various methods to arrange or partition the electrical connections for electrostatic chuck electrodes and the sensor RF probe electrodes. One approach is to use a subset of a chuck electrodes for an electrostatic chuck and the remaining electrodes for the sensor electrodes. For instance, one method is to connect the sensor RF energy source 40 to the center and edge electrodes (1 and 12). Probes, 2, 4, 6, 8, and 10 will be used for the electrostatic chuck operation via voltage pulse trains. Electrodes 3, 5, 7, 9 and 11 are used to probe or monitor the induced RF voltages on them via capacitive contacts.

Figure 6B:
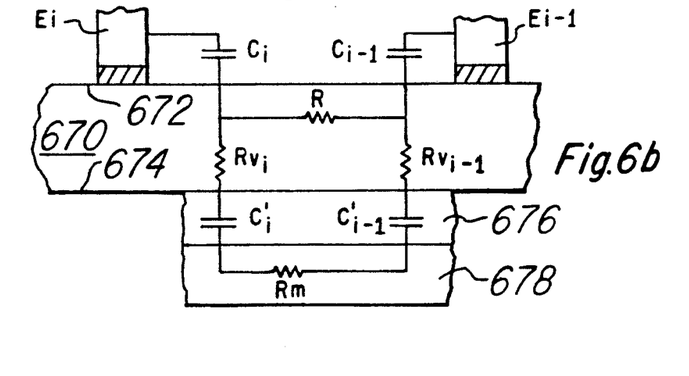
FIG. 6b is a greatly simplified cross-sectional view of a wafer being measured.

The operation of the system will now be described with reference to FIG. 6. FIG. 6a illustrates an equivalent electrical circuit for the system shown in FIG. 1 while FIG. 6b illustrates a greatly simplified diagram of a wafer to aid in understanding the equivalent circuit. The input nodes are labeled 1 through 12. These input nodes correspond to electrodes 101-112.

In the exemplary embodiment described here, the output voltages will be monitored at nodes 3, 5, 7, 9 and 11 and are referred to as $V_{mi}$ (where i is the node index). In this case, the sheet resistance will be determined radially in five different places (e.g., with an electrode pattern as illustrated in FIG. 2). As previously discussed, the sheet resistance may also be measured circumferentially as well. If an end point or average measurement is required only two nodes, i.e., electrodes, can be monitored.

Referring now to FIG. 6b along with 6a, the capacitance $C_i$ (i between 1 and 12 in this example) represents the capacitance between the electrode $E_i$ and the wafer 670. The resistance elements $R_{j-k}$ (for example, $R_{12-11}$ or $R_{11-9}$) represent the bulk lateral resistance through the wafer 670 while the resistance $R_{Vi}$ is representative of the vertical resistance down into the wafer, i.e., from the top surface 674 to the backside surface 672. The capacitance elements $C_i'$ are the capacitance between the wafer bulk 670 and the conductive material 678. As illustrated in FIG. 6b, an insulating layer 676 may be present between wafer substrate 670 and conductive layer 678. In fact, the sheet resistance measurement technique may be used with almost any semiconductor wafer configuration since the frequency of the RF measurement signal may be adjusted to optimize for various capacitances. It is noted that the conductive material 678 may be deposited or etched during the measurement process and as such the fabrication process may be better controlled.

In the exemplary method shown, RF current is introduced to the wafer by RF current source 40 which is connected to node 12 (the body of the chuck in FIG. 2). The current source 40 is also connected to electrode 1 (center of electrode in FIG. 2). Also included in line with the current source 40 is an external blocking capacitor 42 which is provided to block any DC current. Since the external capacitor is in series with the electrode capacitances $C_1$ and $C_{12}$, it may be eliminated if not required.

Although illustrated as a current source 40, a voltage source may be substituted and similar results achieved.

The RF source frequency is optimized such that 1) the RF frequency is chosen to be large enough in order to make the capacitive or reactive impedance of the probe contacts (including any dielectric layers on wafer backside) very small compared to the conductive film resistance values between probe electrodes, and 2) the RF source frequency is small enough to make the AC skin depth much larger and the wafer thickness on the semiconductor substrate and also much larger than the conductive layer thickness in the front-side conductive material layers. Typically, the RF frequency is chosen between 10 and 50 MHz. The RF probe signal may typically be sinusoidal.

Figure 7:
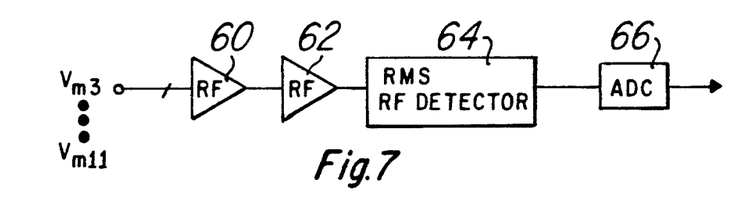
FIG. 7 is a block diagram of an exemplary output circuit.

The induced RF voltages $V_{mi}$ (i=3, 5, 7 or 11) and their relative phases may be measured via external voltage monitors as shown in FIG. 7. The voltage $V_{mi}$ is coupled to high impedance or impedance matched buffer 60. The buffer 60 is coupled to high frequency amplifier 62 which is in turn coupled to an RMS detector 64. The output of the detector 64 may then be coupled to an analog-to-digital converter (ADC) 66 which is in turn coupled to a computer, controller or other means to interpret data.

Each induced RF voltage channel on the probe electrodes 1, 3, 5, 7, 9, or 11 is conected to a separate RF electronic circuit such as the one illustrated in FIG. 7 for example. The RF detector 64 generates a DC signal for the analog digital converter 66. These DC signals are proportional to the induced RF voltages. From circuit theory and known material characteristics, the sheet resistance between two circular probes may be calculated.

Typically, values of $R_V$, the vertical wafer resistance, are small compared to the minimum metal resistance values. As a result, a measurable signal with good signal-to-noise ratio (SNR) can be measured at the probe locations. As the substrate resistivity is increased, however, the vertical resistance values are also increased and become more and more comparable to the conductive layer resistance values. Under these conditions, the vertical wafer resistance dominates the conductive layer resistance and the measured signal will be very weak. However, in practice, the silicon substrate is typically heated to between 300 and 700 degrees C. during sputtering and CVD processes. Under the heated substrate condition, the substrate resistivity is reduced and the metal sheet resistance or resistivity is increased. These changes all help to enhance the SNR due to reduced to parasitic substrate vertical resistance and higher resistivity values.

The lateral substrate resistances have a small shunting effect on the metal resistance elements; however, the substrate lateral resistance values are typically several times larger than the conductor resistance values, resulting in reduced substrate shunting effect. It is expected that for all practical conductor CVD temperatures, the substrate resistivity will not be reduced significantly. It can then be concluded that the sensor can provide a strong enough signal to measure the conductive layer sheet resistance values during the desired processes.

A pulsed or AC (e.g., 100 Hz to 1000 Hz) high-voltage source is used to generate the electrostatic forces required to hold the wafer weight. The frequency of the pulsed high-voltage source is chosen to be much smaller than the RF source frequency. For instance, an electrostatic voltage frequency of less than 10 KHz is typically acceptable.

The electrostatic forces should be strong enough to support the wafer weight. This is particularly true if wafer processing is done in a face-down or vertical configuration. For example, the density of silicon is 2.39 g/cm$^3$. As a result, the total weight of 150 mm wafer with a thickness of only 0.5 mm is about 20.57 grams. Therefore, the force needs to be designed to support this weight (for face-down or vertical wafer processing). For example, a voltage $V_e$ of 36 volts is high enough to hold the wafer even if only using electrodes 2 and 14.

Figure 8:
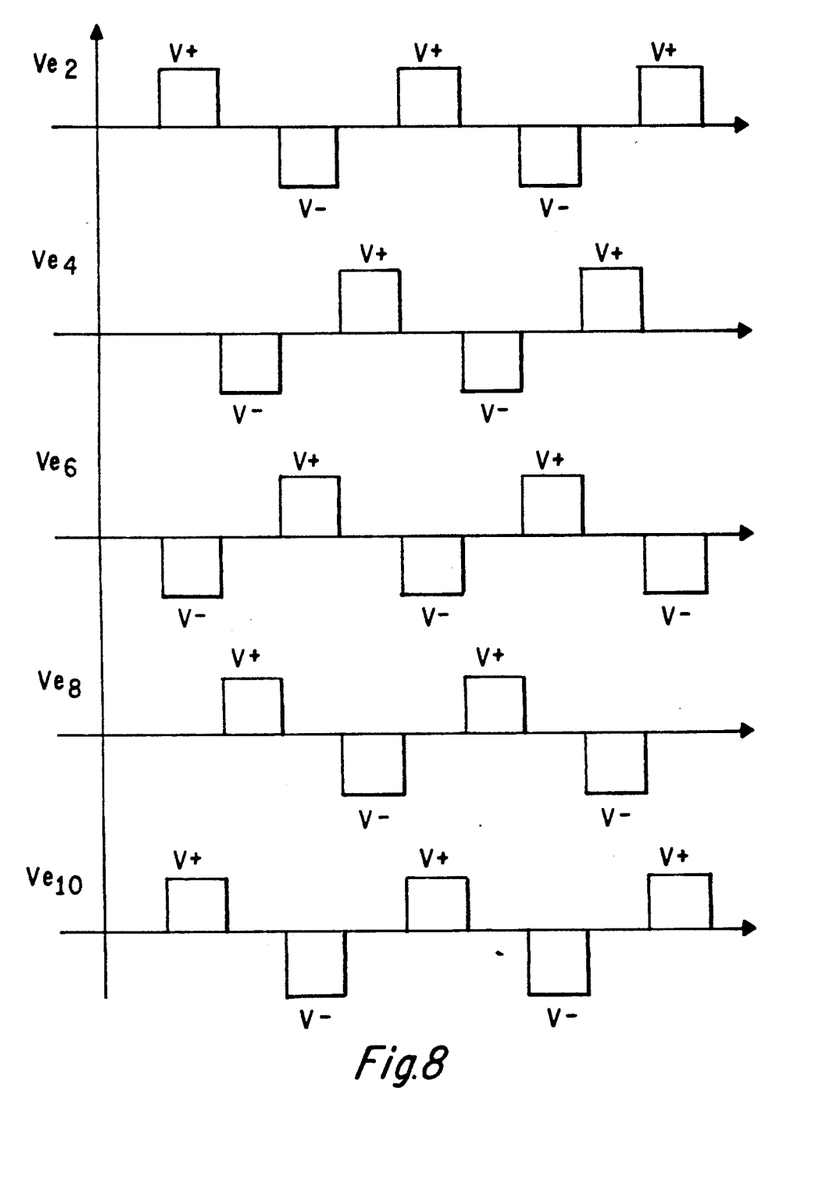
FIG. 8 is a timing diagram of example voltage pulse diagrams for electrostatic chuck operation.

The pulse voltages shown in FIG. 8 show the timing of the voltages applied to each of the electrodes in order to hold the wafer and prevent permanent charging of the wafer backside. It should be noted, there are other methods to arrange or partition the electrodes in the pulsed voltage polarities in order to hold the wafer and avoid permanent charging of the wafer backside. It should also be noted that for the electrostatic chuck operation, the voltage on each electrode (used with a chuck electrostatic field generation) varies with time and has voltages of V+, GND and V−. This configuration will eliminate the wafer sticking problems when the chuck is suppose to release the wafer. Any permanent backside charging should be avoided in order to allow wafer release when electrostatic field voltage sources are turned off.

Other variations may also be used with the present invention. For example, lossless coaxial cables may be used for the sensor RF signal source and monitor connections. These cables should match the load to the source by proper tuning if necessary.

Also, high voltage analog switches may be used to connect DC power sources to electrostatic chuck for pulse voltage generation. An alternative approach would be to use a pulsed AC voltage sources.

Further, at the beginning of the process, when a wafer is mechanically clamped, for example, with three pins, against the chuck surface, a relatively high, for example, several hundred volts amplitude levels are used until the wafer is fully absorbed against the chuck surface. The voltage can then be reduced to the lower levels as described previously.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an electrostatic chuck comprising the steps of:
   forming a series of grooves in the surface of a boron nitride disk;
   forming an insulating material on the surface of each of said grooves;
   forming a plurality of electrically conducting electrodes, the shape of each electrode corresponding to the shape of one of said grooves, such that each electrode will fit in one of said insulated grooves;
   attaching each of said electrodes into said corresponding insulated groove; and
   providing means to electrically couple at least two of said electrodes to an external signal processing and excitation circuit.

2. The method of claim 1 and further comprising the step of forming a layer of insulating material on said electrodes.

3. The method of claim 1 wherein said electrodes comprise aluminum.

4. The method of claim 1 wherein said electrodes comprise a refractory metal.

5. The method of claim 4 wherein said electrodes comprise nickel.

6. The method of claim 1 wherein said electrodes comprise a high temperature alloy.

7. The method of claim 6 wherein said electrodes comprise monel.

8. The method of claim 1 and further comprising the step of connecting a heating/cooling module to said disk.

9. The method of claim 1 wherein said step of forming a series of grooves comprises forming circular grooves.

10. A method of fabricating an electrostatic chuck comprising the steps of:
    forming a first insulating buffer layer on the surface of a disk;
    depositing a plurality of electrodes on the surface of said first insulating buffer layer;
    forming a second insulating layer over said plurality of electrodes, said second insulating layer less than a few microns thick; and
    forming vias to electrically couple each of said electrodes to a processing circuit.

11. The method of claim 10 wherein said electrodes are formed from a refractory metal.

12. The method of claim 10 wehrein said disk comprises a boron nitride disk.

13. The method of claim 10 wherein said step of depositing a plurality of electrodes comprises forming by physical vapor deposition.

14. The method of claim 13 wherein said step of depositing a plurality of electrodes comprises sputtering and patterning said electrodes.

15. The method of claim 10 wherein said processing circuit is external of said chuck.

16. The method of claim 10 wherein said electrodes comprises a metal selected from the group consisting of molybdenum, nickel, platinum or cobalt.

17. The method of claim 10 wherein said second insulating material comprises silicon oxide.

18. The method of claim 10 wherein said plurality of electrodes are formed on a substantially flat surface of said insulating buffer layer.

19. A method of fabricating an electrostatic chuck comprising the steps of:
    providing a boron nitride wafer;
    forming a buffer layer on said wafer, said buffer layer having a substantially flat upper surface;
    depositing a refractory metal layer on said upper surface;
    patterning said refractory metal layer to form a plurality of electrodes;
    forming an insulating layer over said electrodes, said insulating layer less than a few microns thick; and
    forming vias to electrically couple each of said vias to a processing circuit.

20. The method of claim 19 wherein said refractory metal is selected from the group consisting of molybdenum, nickel, platinum or cobalt.

* * * * *